United States Patent

Suemasa et al.

[11] Patent Number: 6,089,181
[45] Date of Patent: Jul. 18, 2000

[54] PLASMA PROCESSING APPARATUS

[75] Inventors: Tomoki Suemasa; Tsuyoshi Ono, both of Shiranemachi; Kouichiro Inazawa, Tokyo, all of Japan

[73] Assignee: Tokyo Electron Limited, Tokyo, Japan

[21] Appl. No.: 08/897,916

[22] Filed: Jul. 21, 1997

[30] Foreign Application Priority Data

Jul. 23, 1996 [JP] Japan .................................. 8-212027

[51] Int. Cl.$^7$ .................................................. C23C 16/00
[52] U.S. Cl. ...................................... 118/723 E; 156/345
[58] Field of Search ........................ 118/723 E, 723 ER; 156/345

[56] References Cited

U.S. PATENT DOCUMENTS

| | | | |
|---|---|---|---|
| 4,539,068 | 9/1985 | Takagi et al. | 156/614 |
| 4,579,618 | 4/1986 | Celestino et al. | 156/345 |
| 4,617,079 | 10/1986 | Tracy et al. | 156/345 |
| 5,405,448 | 4/1995 | Jost et al. | 118/723 E |
| 5,573,597 | 11/1996 | Lantsman | 118/723 MP |
| 5,849,372 | 12/1998 | Annaratone et al. | 427/569 |
| 5,888,414 | 3/1999 | Collins et al. | 216/68 |

*Primary Examiner*—Bruce Breneman
*Assistant Examiner*—Luz Alejandro
*Attorney, Agent, or Firm*—Oblon, Spivak, McClelland, Maier & Neustadt, P.C.

[57] ABSTRACT

In a plasma etching apparatus, a process gas is supplied into a process chamber and converted into plasma by means of RF discharge, and a semiconductor wafer placed on a lower electrode is etched by the plasma. An RF power supply mechanism is connected to the lower electrode for applying thereto a superposed RF power for forming an RF electric field in the process chamber. The RF power supply mechanism has first and second RF power supplies for respectively oscillating a low frequency RF component and a high frequency RF component having a higher frequency than the low frequency RF component. The high frequency RF component from the second frequency RF component supply has its wave form modulated by a modulator on the basis of the wave form of the low frequency RF component from the first frequency RF power supply. Thereafter, the modulated high frequency RF component and the low frequency RF component are superposed upon each other. The high frequency RF component has a larger amplitude at a negative side peak of the low frequency RF component than at a positive side peak of the low frequency RF component.

12 Claims, 4 Drawing Sheets

PLASMA PROCESSING APPARATUS

BACKGROUND OF THE INVENTION

This invention relates to an apparatus which uses plasma resulting from a radio frequency (RF) discharge, to subject a target object, such as a semiconductor wafer, an LCD substrate, etc., to a predetermined process of either etching or deposition. More particularly, the invention relates to a plasma processing apparatus using a superposed RF power obtained by superposing RF components of different frequencies.

In a process for manufacturing a semiconductor device, for example, plasma is generated in a process chamber, and a target object such as a semiconductor wafer is subjected, in the atmosphere of the plasma, to various types of plasma processes including an etching process. The typical plasma etching apparatus for etching a semiconductor wafer is a parallel plate type one. The type of apparatus has a process chamber containing a lower electrode for placing the wafer thereon and an upper electrode opposed to the lower electrode. At the time of performing the etching process, a process gas is introduced into the process chamber, which is exhausted beforehand and has its inside set to a reduced-pressure atmosphere. Then, an RF power is applied to at least one of the lower and upper electrodes. As a result, the process gas is converted into plasma. Using this plasma, the target object or wafer W is etched.

When, in the aforementioned conventional parallel plate type apparatus, an RF power of a predetermined frequency is continuously applied to the electrode(s), the electron temperature in the process chamber will increase, and hence the process gas will be excessively dissociated, resulting in a reduction in the selectivity and the etching rate of a target object processed by the apparatus. Thus, the conventional apparatus is very disadvantageous in enhancing the selectivity and the etching rate. To eliminate the disadvantage of the apparatus is considered to be a technical demand, in light of the fact that semiconductor devices must be subjected to an extraordinarily fine process, realized by the etching process, so that the devices can have an extremely highly integrated and fine structure.

To meet the demand, some techniques for more appropriately modifying the RF power applied to the electrodes at the time of etching are now proposed. A technique using a pulse-modulated RF power is one of these techniques. Further, a technique as disclosed in Japanese Patent Application KOKOKU Publication No. 7-95544 is considered another, which uses a superposed RF power obtained by superposing an RF component of a higher power and a lower frequency, and an RF component of a lower power and a higher frequency, upon each other.

In the case of using the pulse-modulated RF power, RF discharge does not continue for a long time and hence the etching rate decreases with an increase in pulse interval, although the selectivity increases. Moreover, when the RF power is increased to enhance the etching rate, the electron temperature in the process chamber increases, thereby decreasing the selectivity, and the temperature of the target surface of an object also increases, with the result that the object may well be damaged.

BRIEF SUMMARY OF THE INVENTION

It is an object of the invention to provide a plasma processing apparatus capable of restraining an increase in the electron temperature in a process chamber incorporated therein without reducing the density of plasma.

It is another object of the invention to provide a plasma etching apparatus capable of performing a desired extraordinarily fine process at a high selectivity and etching rate.

According to a first aspect of the present invention, there is provided an apparatus using plasma for processing a target object, comprising:

an airtight process chamber;

a first electrode arranged in the process chamber for supporting the target object;

a second electrode opposed to the first electrode and grounded;

an exhaust for exhausting the process chamber to set the process chamber at a vacuum;

a process gas supply for supplying a process gas into the process chamber; and an RF power supply mechanism for applying a superposed RF power to the first electrode to generate, in the process chamber, an RF electric field for converting the process gas into plasma by means of RF discharge, the superposed RF power being obtained by superposing a low frequency RF component and a high frequency RF component having a higher frequency than the low frequency RF component, upon each other, such that the high frequency RF component has a larger amplitude at a negative side of the low frequency RF component than at a positive side of the low frequency RF component.

According to a second aspect of the present invention, there is provided an apparatus using plasma for processing a target object, comprising:

an airtight process chamber;

a first electrode arranged in the process chamber for supporting the target object;

a second electrode opposed to the first electrode and grounded;

an exhaust for exhausting the process chamber to set the process chamber at a vacuum;

a process gas supply for supplying a process gas into the process chamber; and an RF power supply mechanism for applying a superposed RF power to the first electrode to generate, in the process chamber, an RF electric field for converting the process gas into plasma by means of RF discharge, the superposed RF power being obtained by superposing a low frequency RF component and a high frequency RF component having a higher frequency than the low frequency RF component, upon each other, after wave portions of the low frequency RF component on a positive side are inverted to a negative side by means of full wave rectification.

According to a third aspect of the present invention, there is provided an apparatus using plasma for etching a target object, comprising the constitution of any one of the first and second aspects described above.

In the present invention constructed as above, it is possible to modify and vary the amplitude of a high frequency RF component of a superposed RF power to an optimal value in accordance with the amplitude of a lower frequency RF component of the superposed RF power. Accordingly, the invention can restrain an increase in the electron temperature in the process chamber, and obtain an ion sheath region of a higher density and potential. As a result, desired etching can be performed at a high selectivity and etching rate, in case of an etching apparatus.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
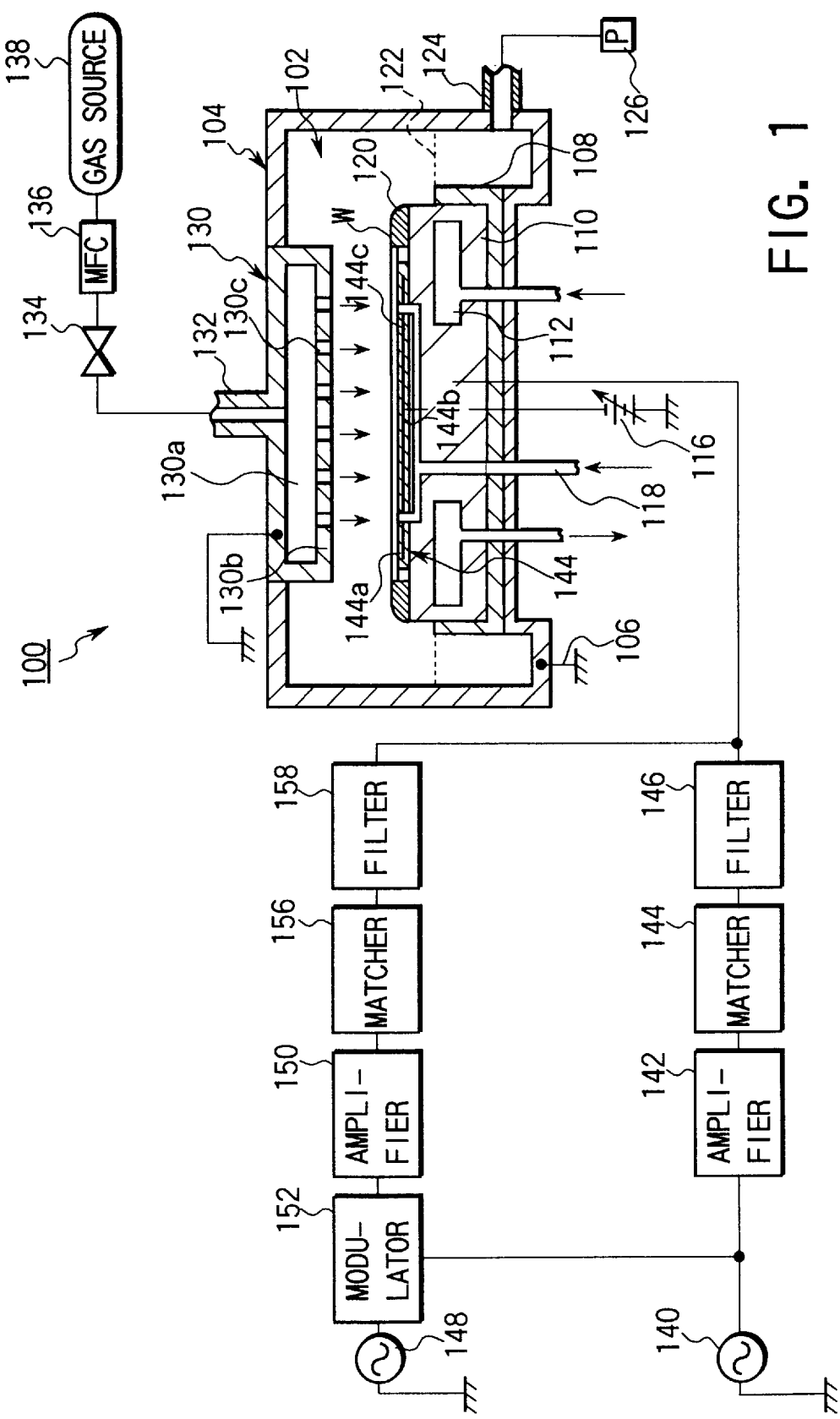
FIG. 1 is a view, showing a parallel plate type plasma etching apparatus as a plasma processing apparatus according to an embodiment of the invention.

Plasma process apparatuses according to the invention will be described in detail with reference to the accompanying drawings. Hereinbelow, structural elements having substantially the same function and structure will be denoted by the same reference numeral, and no duplicate description will be given thereof.

FIG. 1 is a view, showing the structure of a plasma etching apparatus 100 as a plasma processing apparatus according to an embodiment of the invention. The plasma etching apparatus 100 has a substantially cylindrical process chamber 104 defining therein a process field 102 and being closable in an airtight manner. The process chamber 104 is made of a conductive material such as aluminum whose surface has been anodized, and grounded via a ground line 106.

An insulating support plate 108 made of an insulating material such as ceramic is provided at the bottom of the process chamber 104. A susceptor or lower electrode 110 on which a target object such as a semiconductor wafer W is to be placed is provided on the upper surface of the insulating support plate 108. The lower electrode 110 is formed of a substantially cylindrical conductive member made of, for example, aluminum whose surface has been anodized.

The lower electrode 110 contains coolant circulation means 112 for adjusting a target surface of a wafer W to a predetermined temperature via the electrode 110.

An electrostatic chuck 114 having substantially the same shape as the wafer W is provided on a central portion of the upper surface of the lower electrode 110. The electrostatic chuck 114 includes two films such as high-polymer polyimide films 114a and 114c, and a conductive layer 114b held therebtween. A high-voltage DC power, e.g. 1.5 kV, is applicable to the conductive layer 114b from a high-voltage DC power supply 116. When a voltage is applied to the conductive layer 114b, the wafer W placed on the electrostatic chuck 115 is attracted and held on the chuck by means of Coulomb's force.

The electrostatic chuck 114 has gas supply holes (not shown) formed therein in a substantially concentric format and connected to a heat transfer gas supply pipe 118. A heat transfer gas such as helium gas is introduced, through the gas supply holes and the heat transfer gas supply pipe 118, into a fine space defined between the reverse surface of the wafer W and the upper surface of the electrostatic chuck 114. As a result, the efficiency of heat transfer from the coolant circulation means 112 to the wafer W is enhanced.

A substantially annular focus ring 120 is provided on an upper edge portion of the lower electrode 110 such that it surrounds the wafer W placed on the electrostatic chuck 114. The focus ring 120 is made of an insulating material, such as quartz, which does not attract reactive ions and the like, so that it can cause reactive ions and the like resulting from plasma to be effectively radiated onto the wafer W placed inside the ring.

An exhaust ring 122 with multiple baffle holes formed therein is provided between the lower electrode 110 and the inner wall of the process chamber 104 such that it surrounds the lower electrode 110. The exhaust ring 122 functions to adjust the flow of, e.g., a process gas in the process chamber 104 so that it can be uniformly exhausted therefrom.

An exhaust pipe 124 is connected to a lower side wall portion of the process chamber 104, and to a vacuum means 126 such as a turbo-molecular pump. The pressure in the process chamber 104 can be reduced, by operating the vacuum means 126, to a predetermined reduced-pressure atmosphere falling within, for example, 1 mTorr to 100 mTorr.

An upper electrode 130 made of a conductive material such as aluminum whose surface has been anodized is provided at an upper portion of the process chamber 104 opposed to the lower electrode 110. The upper electrode 130 is connected via a valve 134 and a mass-flow controller MFC 136 to a gas introduction pipe 132 which is connected to a process gas source 138. The upper electrode 130 has a hollow structure, i.e. includes a hollow portion 130a. The upper electrode 130 further includes a surface 130b opposed to the wafer W and having multiple discharge ports 130c formed therein. Thus, a predetermined process gas, such as $C_4F_8$, from the process gas source 138 is introduced into the hollow portion 130a of the upper electrode 130 through the valve 134 and the gas introduction pipe 132 after the flow rate of the gas is adjusted by the mass-flow controller MFC 136. The process gas is further introduced into the process field 102 through the discharge ports 130c.

An RF power supply mechanism is connected to the lower electrode 110 to generate in the process container 104 an RF electric field for converting the process gas into plasma by means of RF discharge. The RF power supply mechanism comprises a combination circuit of a low frequency RF section and a high frequency RF section which have first and second RF signal supplies 140 and 148, respectively. A low frequency RF signal and a high frequency RF signal output from the low frequency and high frequency RF sections, respectively, are superposed and applied as a superposed RF power to the lower electrode 110.

More specifically, the first RF signal supply 140 oscillates a relatively low frequency RF signal of 100 KHz to 10 MHz, for example, 380 kHz. This low frequency RF signal is amplified by an amplifier 142 and then applied to the lower electrode 110 via a matcher 144 and a filter 146. The filter 146 is used to prevent the high frequency RF signal of the high frequency RF section from being input to the low frequency RF section.

On the other hand, the second RF signal supply 148 oscillates a relatively high frequency RF signal of 10 MHz to 100 MHz, for example, 13.56 MHz. This high frequency RF signal is modulated by a modulator 152, then amplified by an amplifier 150, and applied to the lower electrode 110 via a matcher 156 and a filter 158. The filter 158 is used to prevent the low frequency RF signal of the low frequency RF section from being input to the high frequency RF section.

The modulator 152 of the high frequency RF section receives the low frequency RF signal from the first RF signal supply 140, as well as the high frequency RF signal. The modulator 152 varies the amplitude of the high frequency RF signal in accordance with the phase of the low frequency RF signal. In this embodiment, the modulator 152 adjusts the amplitude of the high frequency RF signal such that the high frequency RF signal has a large amplitude on the negative side of the low frequency RF signal, and has a small amplitude on the positive side of the low frequency RF signal. The phase at which the high frequency RF signal has a large amplitude, or the amplitude of the high frequency RF signal can be varied by adjusting the modulator 152.

Further, in this embodiment, amplified degrees are set such that the voltage of the high frequency RF signal output from the amplifier 150 is greater than that of the low frequency RF signal output from the amplifier 142. Accordingly, the voltage of the high frequency component of a resultant superposed RF power is relatively greater than the low frequency component of the superposed RF power.

Figure 2:
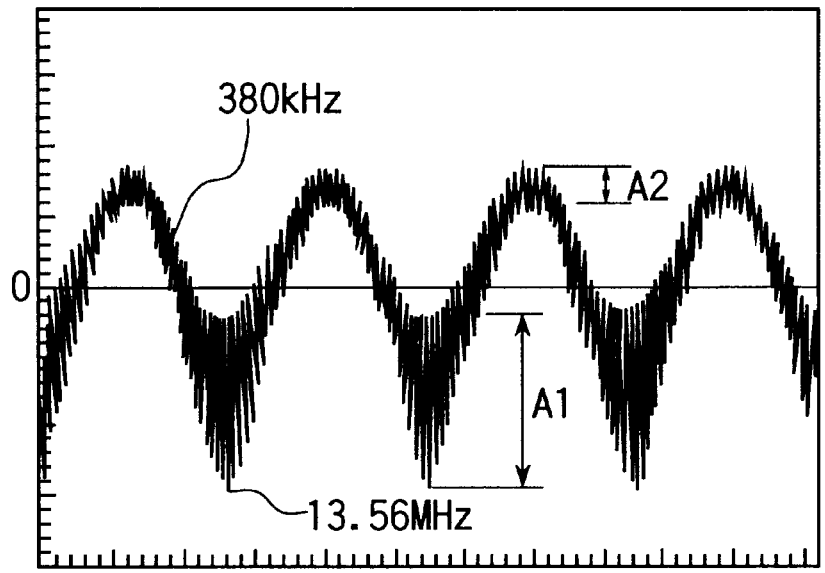
FIG. 2 is a graph, showing a wave form of a superposed RF power used in the apparatus of FIG. 1.

FIG. 2 is a graph, showing a wave form of a superposed RF power on the lower electrode 110. As is shown in FIG. 2, the high frequency RF component has a large amplitude A1 in the vicinity of a negative side peak of the low frequency RF component, and a small amplitude A2 in the vicinity of a positive side peak of the low frequency RF component.

A method will now be described, which is employed in the plasma etching apparatus 100 of FIG. 1 for etching a target film, such as a silicon oxide film, formed on the semiconductor wafer W.

First, the wafer W is placed on the lower electrode 110 in the process field 102, and attracted and held by the electrostatic chuck 114. The target film on the wafer W is kept at a predetermined temperature of, for example, 25° C. by means of the coolant circulation means 112 provided in the lower electrode 110. At this time, the efficiency of heat transfer between the lower electrode 110 and the wafer W is enhanced by a heat transfer gas such as helium gas supplied through the gas supply pipe 118 and the gas supply hole of the electrostatic chuck 114.

On the other hand, the gas in the process field 102 is exhausted by the vacuum means 126 through the exhaust pipe 124 and the exhaust ring 122, and the pressure in the field 102 is kept at a predetermined reduced-pressure atmosphere of, for example, 20 mTorr. While the process field 102 is being exhausted, a predetermined process gas such as $C_4F_8$ is introduced into the field 102 through the mass-flow controller MFC 136, the valve 134, the gas introduction pipe 132 and the upper electrode 130.

Under these conditions, a superposed RF power as shown in FIG. 2 is applied from the RF power supply mechanism to the lower electrode 110 to generate an RF electric field in the process field 102. The $C_4F_8$ gas introduced into the process field 102 is converted into plasma gas by the RF electric field due to the superposed RF power, thereby etching the silicon oxide film on the wafer W.

To create the superposed RF power to be applied to the lower electrode 110, the RF power supply mechanism superposes the lower frequency RF signal of 380 kHz and the high frequency RF signal of 13.56 MHz oscillated from the first and second RF signal supplies 140 and 148, respectively. At this time, the modulator 152 modulates, as described above, the amplitude of the high frequency RF signal such that the high frequency RF signal such that the RF signal has a large amplitude on the negative side of the low frequency RF signal, and has a small amplitude on the positive side of the low frequency RF signal. Accordingly, the high frequency RF component has a larger amplitude in the vicinity of a negative side peak of the low frequency RF component, than in the vicinity of a positive side peak of the low frequency RF component.

During etching, when the superposed RF power applied to the lower electrode 110 is negative (i.e. when the part below 0 V is applied, in the wave form of the superposed RF power shown in FIG. 2), no electrons flow between the upper and lower electrodes 130 and 110, and the lower electrode 110 is charged with negative electricity. Accordingly, a space, a so-called ion sheath region, which includes only reactive ions essential to the etching process, is expanded. These reactive ions are generated along with electrons by means of ionization of the process gas while the gas is converted into plasma. The reactive ions are attracted by the wafer W, thereby advancing the etching of the wafer.

On the other hand, when the superposed RF power applied to the lower electrode 110 is positive (i.e. when the part above 0 V is applied, in the wave form of the superposed RF power shown in FIG. 2), electrons flow between the upper and lower electrodes 130 and 110. Accordingly, the potential of the ion sheath region is reduced, and the reactive ions are not accelerated, thereby decelerating the etching process. This is the reason why desired etching characteristics can be obtained where the high frequency RF component is set at a larger amplitude in the vicinity of a negative side peak of the low frequency RF component, than in the vicinity of a positive side peak of the low frequency RF component.

Moreover, where the superposed RF power is applied to the lower electrode 110, the high frequency RF component of the voltage wave on the target surface of the wafer W is liable to have a large amplitude while the low frequency RF component is negative, and a small amplitude while the low frequency RF component is positive, due to the so-called diode characteristics of the plasma and the ion sheath region. Accordingly, in the invention, changes in the amplitude of the high frequency RF power and also the magnitude thereof can be controlled without acting against the diode characteristics. As a result, plasma of a high density can be obtained, and further highly uniform etching can be performed at a high rate since excessive dissociation of the process gas can be prevented while RF discharge is continued.

[Experiments]

Comparative experiments of etching were performed concerning the case of using a non-superposed RF power (i.e. using only a high frequency RF component), and the case of using a superposed RF power as shown in FIG. 2, respectively, as the RF power applied to the lower electrode 110 in the apparatus of FIG. 1.

In the experiments, $C_4F_8$ gas was used as the etching gas to etch a silicon oxide film formed on a semiconductor wafer W. 13.56 MHz RF-powers at 1300 W, 1500 W and 1700 W were used as non-superposed RF powers. Further, a power obtained by superposing, using the RF power supply mechanism shown in FIG. 1, a high frequency RF component of 13.56 MHz at 1500 W and a low frequency RF component of 380 kHz at 500 W upon each other, and a power obtained by superposing a high frequency RF component of 13.56 MHz at 1500 W and a low frequency RF component of 380 kHz at 1000 W upon each other were used as superposed RF powers.

Figure 3:
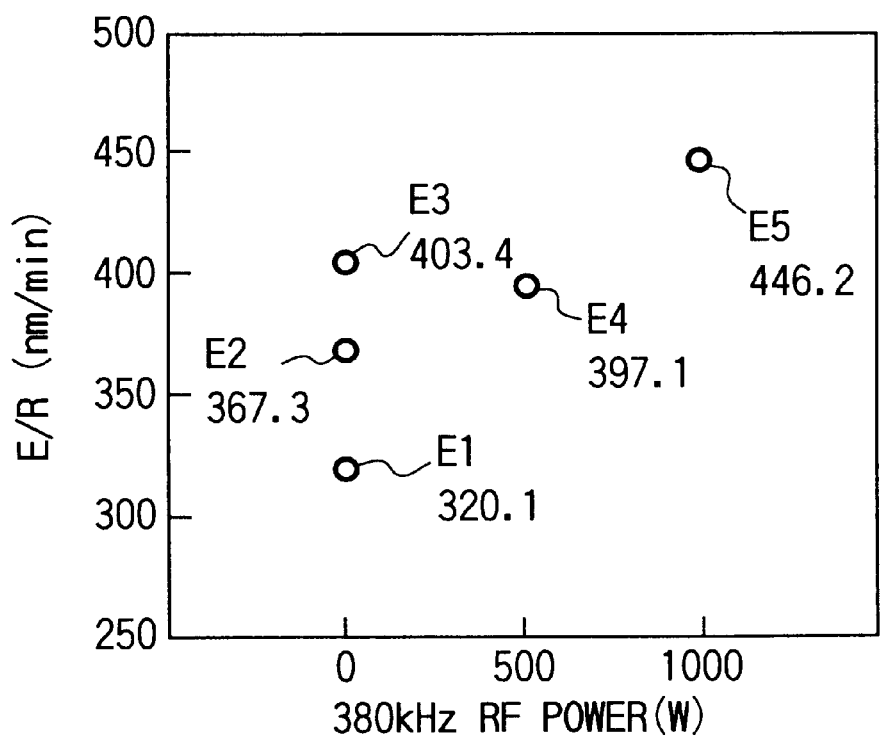
FIG. 3 is a graph, showing differences in etching rate between the cases where the apparatus of FIG. 1 etches a semiconductor wafer using a non-superposed RF power and a superposed RF power, respectively.

FIG. 3 is a graph, showing etching rates resulting from the experiments. In FIG. 3, points E1, E2 and E3 correspond to the 13.56 MHz non-superposed RF powers at 1300 W, 1500 W and 1700 W, respectively. Further, points E4 and E5 correspond to a power obtained by superposing a high frequency RF component of 13.56 MHz at 1500 W and a low frequency RF component of 380 kHz at 500 W upon each other, and a power obtained by superposing a high frequency RF component of 13.56 MHz at 1500 W and a low frequency RF component of 380 kHz at 1000 W upon each other, respectively. Moreover, a numerical value put in the vicinity of each of the points E1–E5 indicates an etching rate (nm/min) at the point.

As is evident from FIG. 3, the etching rate in the case of using the superposed RF power corresponding to the point E5 is higher by about 21% than that in the case of using the non-superposed RF power corresponding to the point E2, and is higher by about 11% than that in the case of using the non-superposed RF power corresponding to the point E3.

In addition, where the magnitude of an RF power having a constant frequency is increased in the conventional case, a high etching rate can be obtained, but the electron temperature in the process chamber is also increased, thereby reducing the selectivity. It has been found from the experiments that this disadvantage can be minimized by using a superposed RF power as shown in FIG. 2 and having its high frequency RF component modulated, with the result that the etching can be performed at a high selectivity and etching rate.

Figure 4:
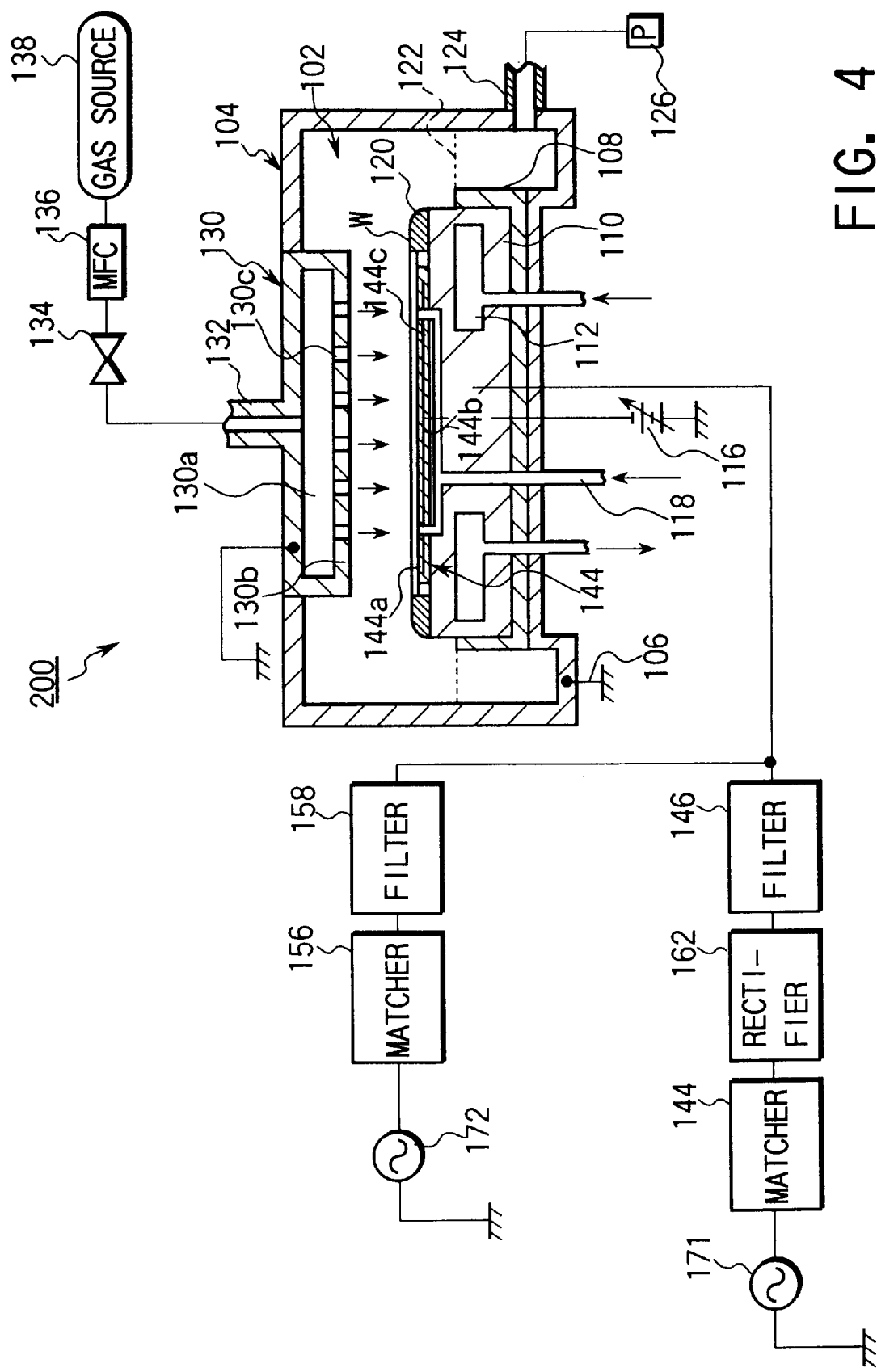
FIG. 4 is a view, showing a parallel plate type plasma etching apparatus as a plasma processing apparatus according to another embodiment of the invention.

FIG. 4 shows a plasma etching apparatus 200 as a plasma processing apparatus according to another embodiment of the invention.

This apparatus differs from the apparatus of FIG. 1 only in the structure of the RF power supply mechanism connected to the lower electrode 110. Specifically, the RF power supply mechanism shown in FIG. 4 comprises a combination circuit of a low frequency RF section and a high frequency RF section which have first and second RF power supplies 171 and 172, respectively. A low frequency RF signal and a high frequency RF signal output from the low frequency and high frequency RF sections, respectively, are superposed and applied as a superposed RF power to the lower electrode 110.

More specifically, the first RF power supply 171 oscillates a relatively low frequency RF signal of 100 KHz to 10 MHz, for example, 380 kHz. This low frequency RF signal is guided to a full wave rectifier 162 via a matcher 144. The full wave rectifier 162 contains full wave rectifying means, such as a diode bridge, for inverting the wave portions of the low frequency RP power on a positive side are inverted to a negative side. The low frequency RF signal with negative wave portions only is applied to the lower electrode 110 via a filter 146. The filter 146 is used to prevent the high frequency RF signal of the high frequency RF section from being input to the low frequency RF section.

On the other hand, the second RF power supply 172 oscillates a relatively high frequency RF signal of 10 MHz to 100 MHz, for example, 13.56 MHz. This high frequency RF signal is applied to the lower electrode 110 via a matcher 156 and a filter 158. The filter 158 is used to prevent the low frequency RF signal of the low frequency RF section from being input to the high frequency RF section.

The low frequency RF signal only with the negative wave portions guided through the filter 146 and the high frequency RF signal guided through the filter 158 are superposed upon each other, thereby forming a superposed RF power.

Figure 5:
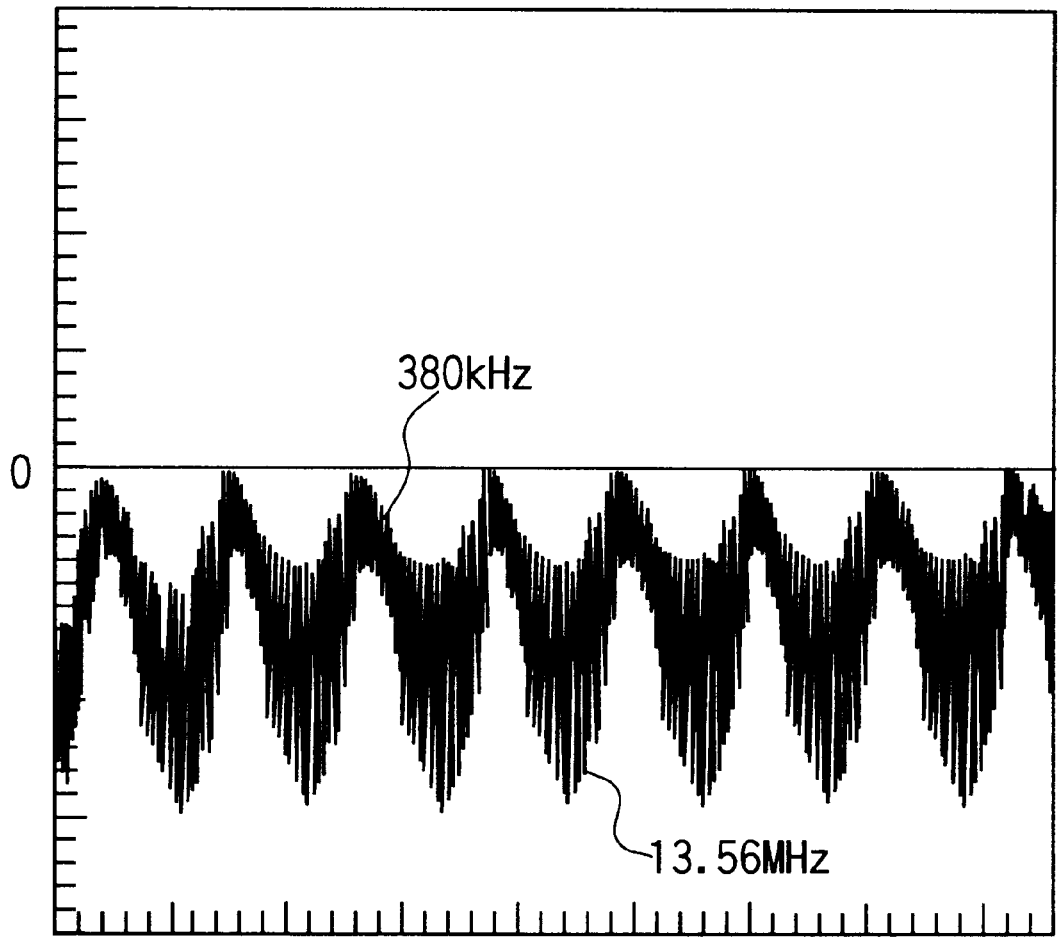
FIG. 5 is a graph, showing a wave form of a superposed RF power used in the apparatus of FIG. 4.

FIG. 5 is a graph, showing a wave form of a superposed RF power applied to the lower electrode 110. As is shown in FIG. 5, the low frequency RF component of the superposed RF power exists on the negative side only. Further, the amplitude of the high frequency RF component is greater in the vicinity of a negative side peak of the low frequency RF component than in the vicinity of a positive side peak of it, due to the so-called diode characteristics of the plasma and the ion sheath region.

Thus, in the embodiment of FIG. 4 which uses the superposed RF power shown in FIG. 5, ions contained in plasma can be effectively attracted to the wafer W, so that the etching rate is increased, thereby enabling desired etching.

The full wave rectifier 162, which is incorporated in the plasma etching apparatus 200 of FIG. 4, may be interposed between the matcher 144 and the filter 146 in the plasma etching 100 of FIG. 1. In this case, the plasma etching apparatus 100 can additionally have the function for setting the amplitude of the high frequency RF signal to be greatest in the vicinity of the negative side peak of the low frequency RF signal. As a result, in the plasma etching apparatus 100, the high frequency RF signal has a portion of a small amplitude, which means that the process gas will not excessively be dissociated and hence etching will be performed uniformly at a uniform etching rate.

Although the above-described preferable embodiments are directed to plasma process apparatuses for etching a silicon oxide film on a semiconductor wafer, the invention is not limited to them. It is a matter of course that anyone skilled in the art can conceive to modify the invention in various manners without departing from the scope of the claims which will be set out below.

For example, in the above-described embodiments, specific frequencies and powers are used for each of the low frequency RF component and the high frequency RF component, which constitute the superposed RF power. However, the invention is also applicable to a case where the frequency and power are variable.

Furthermore, the superposed RF power supply mechanism can have various structures other than those described in the embodiments. It suffices if the mechanism can supply the superposed RF power.

In addition, in the above-described embodiments, the process of etching a target object on a semiconductor wafer has been described using the parallel plate type plasma etching apparatuses. The invention, however, is not limited to the embodiments, but may be also applicable to a plasma process performed by another type plasma processing apparatus, for example, an ashing process of an LCD substrate.

We claim:

1. An apparatus using plasma for processing a target object, comprising:

an airtight process chamber;

a first electrode arranged in said process chamber for supporting said target object;

a second electrode opposed to said first electrode and grounded;

an exhaust for exhausting said process chamber to set said process chamber at a vacuum;

a process gas supply for supplying a process gas into said process chamber; and an RF power supply mechanism configured to apply a superposed RF power to said first electrode to generate, in said process chamber, an RF electric field for converting said process gas into plasma by means of RF discharge, said superposed RF power being obtained by superposing a low frequency RF component and a high frequency RF component having a higher frequency than said low frequency RF component, upon each other, such that said high frequency RF component has a larger amplitude at a negative side of said low frequency RF component than at a positive side of said low frequency RF component.

2. The apparatus according to claim 1, wherein said RF power supply mechanism includes adjustment means for adjusting said high frequency RF component over its amplitude such that said high frequency RF component has a larger amplitude at a negative side of said low frequency RF component than at a positive side of said low frequency RF component.

3. The apparatus according to claim 2, wherein said RF power supply mechanism includes a modulator for modulating a wave form of said high frequency RF component on said basis of a wave form of said low frequency RF component.

4. The apparatus according to claim 1, wherein said RF power supply mechanism includes a low frequency RF section and a high frequency RF section which have first and second RF power supplies, respectively, said low and high frequency RF sections having their output lines connected to each other, said low frequency RF section having at an output side thereof a filter for preventing said high frequency RF component of said high frequency RF section from entering said low frequency RF section, and said high frequency RF section having at an output side thereof a filter for preventing said low frequency RF component of said low frequency RF section from entering said high frequency RF section.

5. An apparatus using plasma for processing a target object, comprising:

an airtight process chamber;

a first electrode arranged in said process chamber for supporting said target object;

a second electrode opposed to said first electrode and grounded;

an exhaust for exhausting said process chamber to set said process chamber at a vacuum;

a process gas supply for supplying a process gas into said process chamber; and an RF power supply mechanism configured to apply a superposed RF power to said first electrode to generate, in said process chamber, an RF electric field for converting said process gas into plasma by means of RF discharge, said superposed RF power being obtained by superposing a low frequency RF component and a high frequency RF component having a higher frequency than said low frequency RF component, upon each other, after wave portions of said low frequency RF component on a positive side are inverted to a negative side by means of full wave rectification.

6. The apparatus according to claim 5, wherein said RF power supply mechanism includes a low frequency RF section and a high frequency RF section which have first and second RF power supplies, respectively, said low and high frequency RF sections having their output lines connected to each other, said low frequency RF section having at an output side thereof a filter for preventing said high frequency RF component of said high frequency RF section from entering said low frequency RF section, and said high frequency RF section having at an output side thereof a filter for preventing said low frequency RF component of said low frequency RF section from entering said high frequency RF section.

7. An apparatus using plasma for etching a target object, comprising:

an airtight process chamber;

a first electrode arranged in said process chamber for supporting said target object;

a second electrode opposed to said first electrode and grounded;

an exhaust for exhausting said process chamber to set said process chamber at a vacuum;

a process gas supply for supplying a process gas containing an etching gas into said process chamber; and an RF power supply mechanism configured to apply a superposed RF power to said first electrode to generate, in said process chamber, an RF electric field for converting said process gas into plasma by means of RF discharge, said superposed RF power being obtained by superposing a low frequency RF component and a high frequency RF component having a higher frequency than said low frequency RF component, upon each other, such that said high frequency RF component has a larger amplitude at a negative side of said low frequency RF component than at a positive side of said low frequency RF component.

8. The apparatus according to claim 7, wherein said RF power supply mechanism includes adjustment means for adjusting said high frequency RF component over its amplitude such that said high frequency RF component has a larger amplitude at a negative side of said low frequency RF component than at a positive side of said low frequency RF component.

9. The apparatus according to claim 8, wherein said RF power supply mechanism includes a modulator for modulating a wave form of said high frequency RF component on said basis of a wave form of said low frequency RF component.

10. The apparatus according to claim 7, wherein said RF power supply mechanism includes a low frequency RF section and a high frequency RF section which have first and second RF power supplies, respectively, said low and high frequency RF sections having their output lines connected to each other, said low frequency RF section having at an output side thereof a filter for preventing said high frequency RF component of said high frequency RF section from entering said low frequency RF section, and said high frequency RF section having at an output side thereof a filter for preventing said low frequency RF component of said low frequency RF section from entering said high frequency RF section.

11. An apparatus using plasma for etching a target object, comprising:

an airtight process chamber;

a first electrode arranged in said process chamber for supporting said target object;

a second electrode opposed to said first electrode and grounded;

an exhaust for exhausting said process chamber to set said process chamber at a vacuum;

a process gas supply for supplying a process gas containing an etching gas into said process chamber; and an RF power supply mechanism configured to apply a superposed RF power to said first electrode to generate, in said process chamber, an RF electric field for converting said process gas into plasma by means of RF discharge, said superposed RF power being obtained by superposing a low frequency RF component and a high frequency RF component having a higher frequency than said low frequency RF component, upon each other, after wave portions of said low frequency RF component on a positive side are inverted to a negative side by means of full wave rectification.

12. The apparatus according to claim 11, wherein said RF power supply mechanism includes a low frequency RF section and a high frequency RF section which have first and second RF power supplies, respectively, said low and high frequency RF sections having their output lines connected to each other, said low frequency RF section having at an output side thereof a filter for preventing said high frequency RF component of said high frequency RF section from entering said low frequency RF section, and said high frequency RF section having at an output side thereof a filter for preventing said low frequency RF component of said low frequency RF section from entering said high frequency RF section.

* * * * *

UNITED STATES PATENT AND TRADEMARK OFFICE
CERTIFICATE OF CORRECTION

PATENT NO. : 6,089,181

DATED : July 18, 2000

INVENTOR(S): Tomoki SUEMASA, et al.

It is certified that an error appears in the above-identified patent and that said Letters Patent is hereby corrected as shown below:

On the Title Page, Item [75], the Inventors' residence is listed incorrectly.
Item [75] should read as follows:

--- [75] Inventors: Tomoki Suemasa; Tsuyoshi Ono, both of Nakagoma-gun; Kouichiro Inazawa, Tokyo, all of Japan ---

Signed and Sealed this

Fifteenth Day of May, 2001

Attest:

NICHOLAS P. GODICI

Attesting Officer        Acting Director of the United States Patent and Trademark Office